(12) United States Patent
Park

(10) Patent No.: US 9,959,164 B2
(45) Date of Patent: May 1, 2018

(54) SEMICONDUCTOR DEVICE AND DRIVING METHOD THEREOF

(71) Applicant: SK hynix Inc., Icheon-si Gyeonggi-do (KR)

(72) Inventor: Min Su Park, Seoul (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 38 days.

(21) Appl. No.: 15/170,446

(22) Filed: Jun. 1, 2016

(65) Prior Publication Data

US 2017/0242749 A1    Aug. 24, 2017

(30) Foreign Application Priority Data

Feb. 22, 2016  (KR) .................. 10-2016-0020575

(51) Int. Cl.
| | |
|---|---|
| *G11C 29/00* | (2006.01) |
| *G06F 11/10* | (2006.01) |
| *G11C 11/406* | (2006.01) |
| *G11C 11/408* | (2006.01) |
| *G11C 11/4096* | (2006.01) |
| *G11C 29/52* | (2006.01) |

(52) U.S. Cl.
CPC ........ *G06F 11/1068* (2013.01); *G11C 11/406* (2013.01); *G11C 11/408* (2013.01); *G11C 11/4096* (2013.01); *G11C 11/40611* (2013.01); *G11C 29/52* (2013.01); *G11C 2211/4062* (2013.01)

(58) Field of Classification Search
CPC ............... G06F 11/1068; G11C 11/408; G11C 11/4096; G11C 29/52; G11C 11/406
See application file for complete search history.

(56) References Cited

U.S. PATENT DOCUMENTS

| | | | | |
|---|---|---|---|---|
| 2011/0035646 A1* | 2/2011 | Nakanishi | ........... | G06F 11/1068 714/763 |
| 2011/0119558 A1* | 5/2011 | Koshiyama | ......... | G06F 11/1048 714/758 |
| 2012/0182821 A1* | 7/2012 | Perego | ................ | G06F 11/1048 365/230.03 |
| 2014/0133259 A1* | 5/2014 | Perego | ................ | G06F 11/1048 365/230.01 |
| 2015/0067448 A1* | 3/2015 | Son | ........................ | G11C 29/52 714/773 |
| 2015/0199234 A1 | 7/2015 | Choi et al. | | |
| 2016/0055056 A1* | 2/2016 | Son | ..................... | G06F 11/1068 714/764 |

* cited by examiner

*Primary Examiner* — Thien Nguyen
(74) *Attorney, Agent, or Firm* — William Park & Associates Ltd.

(57) ABSTRACT

A driving method of a semiconductor device and semiconductor device may be provided. The semiconductor device may include a cell array including a plurality of data areas. The semiconductor device may include an ECC (Error correction Code) area configured to be assigned to only less than all of the data areas at any one time to store parity data corresponding to the data areas.

17 Claims, 9 Drawing Sheets

SEMICONDUCTOR DEVICE AND DRIVING METHOD THEREOF

CROSS-REFERENCES TO RELATED APPLICATION

The present application claims priority under 35 U.S.C. § 119(a) to Korean application number 10-2016-0020575, filed on Feb. 22, 2016, in the Korean Intellectual Property Office, which is incorporated herein by reference in its entirety.

BACKGROUND

1. Technical Field

Various embodiments generally relate to a semiconductor device and a driving method thereof, and more particularly, to a technology related to a semiconductor device including an error correction code circuit.

2. Related Art

As a voltage applied to a memory cell is lowered and a cell size is reduced, deterioration of soft error tolerance has been problematic. As a semiconductor integrated device using an error correction code (hereinafter, referred to as an 'ECC') circuit that corrects such a data error, a circuit technology for correcting failed bits by adding a parity bit to normal data has been disclosed.

That is, after a semiconductor memory device is fabricated, a test is performed to select failed memory cells. According to one of the methods for improving a yield of a semiconductor memory device, an ECC function is provided to the semiconductor memory device.

Such an ECC circuit may be defined as a circuit that performs a function of detecting and correcting defects of data in realtime, and normally adds an additional parity bit to DQ data in DQ data transmission of a memory. That is, the semiconductor memory device checks whether the DQ data and the added parity bit are transmitted according to a prescribed protocol, thereby detecting a data error.

In an on-die ECC circuit, an ECC area is assigned in order to perform an ECC operation in correspondence to all cell arrays. Therefore, as the size of a data area increases, the size of the ECC area also increases, resulting in an increase in the area of a parity area for storing a parity bit.

SUMMARY

In an embodiment, a semiconductor device may be provided. The semiconductor device may include a cell array including a plurality of data areas may be provided and a data area to be subjected to an ECC (Error correction Code) operation may be sequentially changed in correspondence to an ECC address based on a refresh operation. The semiconductor device may include an ECC area in which the ECC operation is performed in correspondence to some of the plurality of data areas and parity data corresponding to the plurality of data areas may be sequentially stored according to the data areas.

In an embodiment, a method for driving a semiconductor device may be provided. The method may include a step of reading data of a corresponding data area selected from a plurality of data areas based on a refresh signal. The method may include a step of performing a parity operation, and writing a parity bit in an ECC area. The method may include a step of performing an ECC operation for the corresponding data area and correcting an error. The method may include a step of reading data of the corresponding data area and the parity bit when a next refresh signal is applied, performing an ECC operation, and correcting an error.

In an embodiment, a semiconductor device may be provided. The semiconductor device may include a cell array including a plurality of data areas. The semiconductor device may include an ECC (Error correction Code) area configured to be assigned to only less than all of the data areas at any one time to store parity data corresponding to the data areas.

Wherein a data area to be subjected to an ECC operation is sequentially changed in correspondence to an ECC address.

Wherein the data area to be subjected to the ECC operation is sequentially changed in correspondence to the ECC address based on a refresh operation.

Wherein the parity data corresponding to the plurality of data areas is sequentially stored according to the data areas.

DETAILED DESCRIPTION

Various embodiments may be directed to assign a small parity area and change a cell area, where error correction code (ECC) is performed, according to time, thereby reducing a storage space of a parity bit.

According to various embodiments, a cell area, where error correction code (ECC) is performed, may be changed according to time, so that a storage space of a parity bit may be reduced.

Hereinafter, a semiconductor device and a driving method thereof will be described below with reference to the accompanying drawings through various examples of embodiments.

Figure 1:
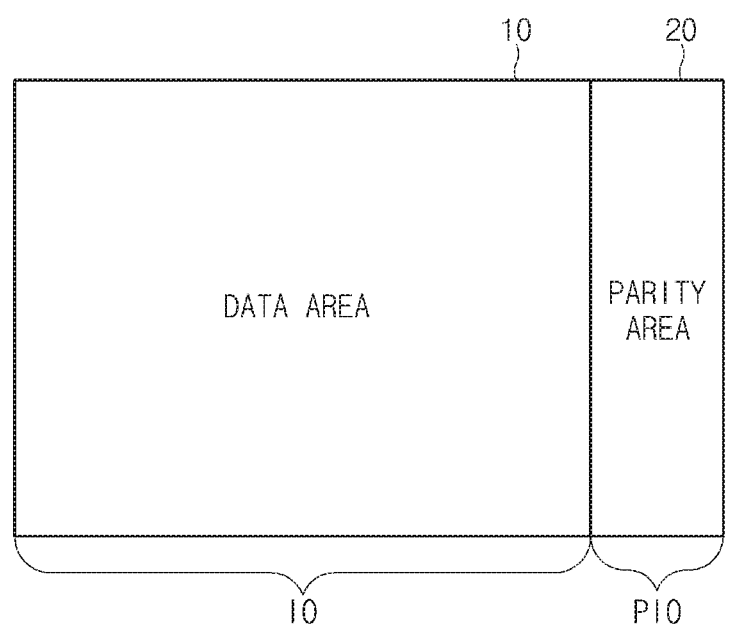
FIG. 1 is a diagram illustrating a representation of an example for explaining a data area and a parity area in a semiconductor device.

FIG. 1 is a diagram illustrating a representation of an example for explaining a data area and a parity area in a semiconductor device.

The semiconductor device includes a data area 10 for storing data and a parity area 20 for storing a parity bit. The data area 10 inputs and outputs (inputs/outputs) the data through a data line IO. The parity area 20 inputs/outputs the parity bit through a parity line PIO.

In the semiconductor device, the parity area 20 is assigned in order to perform an error correction code (hereinafter, referred to as an 'ECC') operation in correspondence to the entire data area 10. Therefore, as the size of the data area 10 increases, the size of the parity area 20 also increases.

A memory cell may perform an undesired abnormal operation, thereby causing an error. Furthermore, when the memory cell is deteriorated during the use thereof and is failed, a critical system error may occur.

In this regard, in order to substantially prevent such a situation from occurring, a test is performed in critical conditions to perform an operation for selecting a weak cell in advance. However, even when products are sold after passing through a sufficient test as described above, undesired defects may also occur due to any reasons during the use thereof.

Even though a 1-bit error occurs in a memory during the use of a semiconductor device, an ECC circuit may be employed as a method capable of repairing the error. When no ECC is applied, fails may occur due to various factors and a critical system error may also occur.

However, in order to use the ECC circuit, an additional parity bit is required. Accordingly, a space for additionally storing a parity bit is required in the existing memory capacity.

Figure 2:
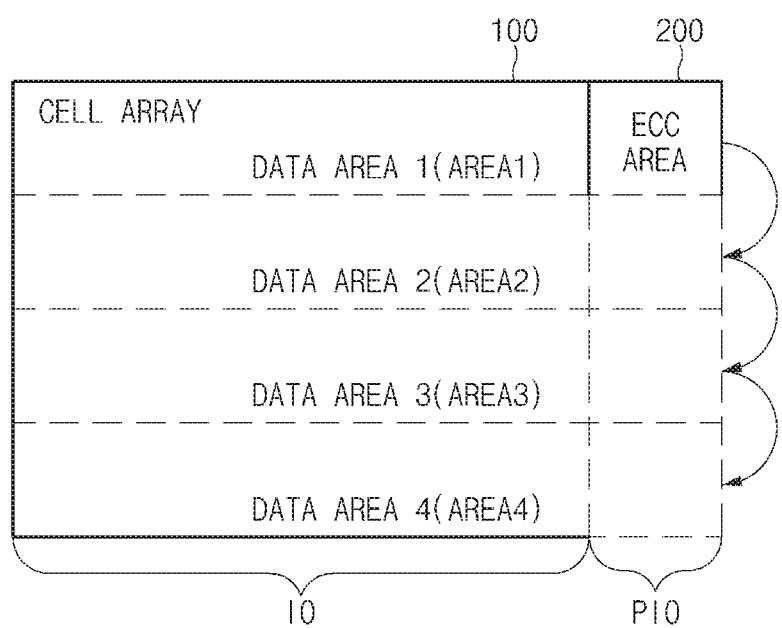
FIG. 2 is a diagram illustrating a representation of an example for explaining the concept of a semiconductor device according to an embodiment.

FIG. 2 is a diagram illustrating a representation of an example for explaining the concept of a semiconductor device according to an embodiment.

The semiconductor device according to an embodiment includes a cell array 100 and an ECC area 200.

The cell array 100 includes a plurality of memory cells and data reading/writing is performed. Furthermore, the cell array 100 is divided into a plurality of data areas AREA1 to AREA4.

The ECC area 200 stores parity data for correcting an error. The ECC area 200 may be arranged at the outermost edge of the cell array 100 and may be assigned to a dummy area. When the ECC area 200 is assigned to a dummy mat, an ECC may be applied without an increase in cells.

Furthermore, the ECC area 200 is assigned to some data areas of the cell array 100 and performs an ECC operation corresponding to the plurality of data areas AREA1 to AREA4. That is, the ECC area 200 is sequentially assigned to the plurality of data areas AREA1 to AREA4 and performs an ECC operation corresponding to one data area.

The semiconductor device of FIG. 1 performs an ECC operation with respect to cells of the entire data area 10. However, in an embodiment, a cell, to which the ECC area 200 is applied, corresponds to a data area (for example, the data area AREA1) which is a part of the entire cell array 100 area, and no ECC is applied to the remaining data areas.

That is, in an embodiment, a space capable of storing a parity bit is not provided for the entire cell array 100, and a parity bit storage space corresponding to a partial data area AREA of the cell array 100 is provided.

With the passage of time, a data area, to which the ECC is applied, is changed, so that an ECC operation may also be sequentially performed for the remaining data areas AREA2 to AREA4. That is, an address, to which the ECC is applied, is not fixed and is changed with the passage of time, so that the ECC may be sequentially applied to the entire cell array 100.

Accordingly, in an embodiment, an error is corrected using the ECC, and the space of the ECC area 200 for storing parity data is not assigned to the entire cell array 100 but is assigned by a size corresponding to one data area AREA, so that an ECC space may be minimized.

Furthermore, the cell array 100 inputs/outputs a specific unit of data through the data line IO. The ECC area 200 inputs/outputs a specific unit of parity data through the parity line PIO.

As described above, the data line IO for inputting/outputting normal data and the parity line PIO for inputting/outputting parity data are separated from each other. In such a case, in a write or read operation, data may be inputted/outputted through the data line separately from the parity data.

Figure 3:
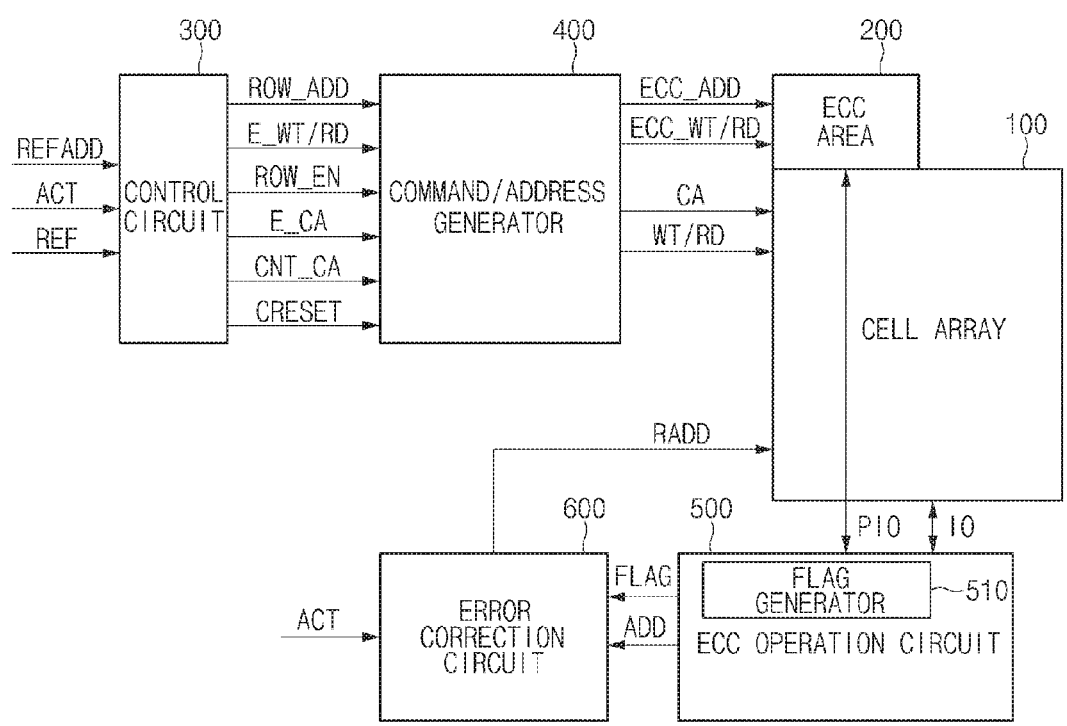
FIG. 3 is a configuration diagram illustration of a representation of an example of a semiconductor device according to an embodiment.

FIG. 3 is a configuration diagram illustration of a representation of an example of the semiconductor device according to an embodiment.

For example, an embodiment includes the cell array 100, the ECC area 200, a control circuit 300, a command/address generator 400, an ECC operation circuit 500, and error correction circuit 600.

The control circuit 300 generates a row address ROW_ADD, an external write/read signal E_WT/RD, a row enable signal ROW_EN, an external column address E_CA, a column address counting signal CNT_CA, and a chip select signal CRESET in correspondence to a refresh address REFADD, an active signal ACT, and a refresh signal REF.

The command/address generator 400 receives the row address ROW_ADD, the external write/read signal E_WT/RD, the row enable signal ROW_EN, the external column address E_CA, the column address counting signal CNT_CA, and the chip select signal CRESET, and generates an ECC address ECC_ADD, an ECC write/read signal ECC_WT/RD, a column address CA, and a write/read signal WT/RD.

The ECC address ECC_ADD and the ECC write/read signal ECC_WT/RD are outputted to the ECC area 200. The column address CA and the write/read signal WT/RD are outputted to the cell array 100.

The ECC operation circuit 500 receives data from the cell array 100 through the data line IO and receives parity data from the ECC area 200 through the parity line PIO, thereby performing an ECC operation.

In a normal active mode, the ECC operation circuit 500 performs the ECC operation in correspondence to a read or write command. When 1-bit fail occurs, such an ECC operation circuit 500 corrects an error in correspondence to data applied through the data line IO and parity data applied through the parity line PIO.

That is, in a read operation of the cell array 100, the ECC operation circuit 500 reads all of the data of the cell array 100 and the parity data of the ECC area 200 and performs an error correction operation. Furthermore, in a write operation of the cell array 100, the ECC operation circuit 500 stores the data in the cell array 100 and stores the parity data in the ECC area 200.

The ECC operation circuit 500 operates an ECC in correspondence to the data and the parity data respectively applied through the data line IO and the parity line PIO, and outputs error-corrected data to an exterior.

The ECC operation circuit 500 outputs a flag signal FLAG, which is activated when failed data occurs, to the error correction circuit 600. The ECC operation circuit 500 includes a flag generator 510 that detects failed data when it occurs and activates the flag signal FLAG. The ECC operation circuit 500 outputs a row address ADD activated for each bank to the error correction circuit 600.

When an active signal ACT is activated, the error correction circuit 600 outputs a row address RADD to the cell array 100 in correspondence to the activated row address ADD and the flag signal FLAG applied from the ECC operation circuit 500, thereby correcting an error in an ECC operation result. That is, when failed data has occurred in the cell array 100 as the operation result of the ECC operation circuit 500, the error correction circuit 600 corrects an error of corresponding fail. Then, in order to substantially prevent defects which may occur later, the error correction circuit 600 may store a failed address, thereby improving the reliability of an address and repairing failed cells.

Figure 4:
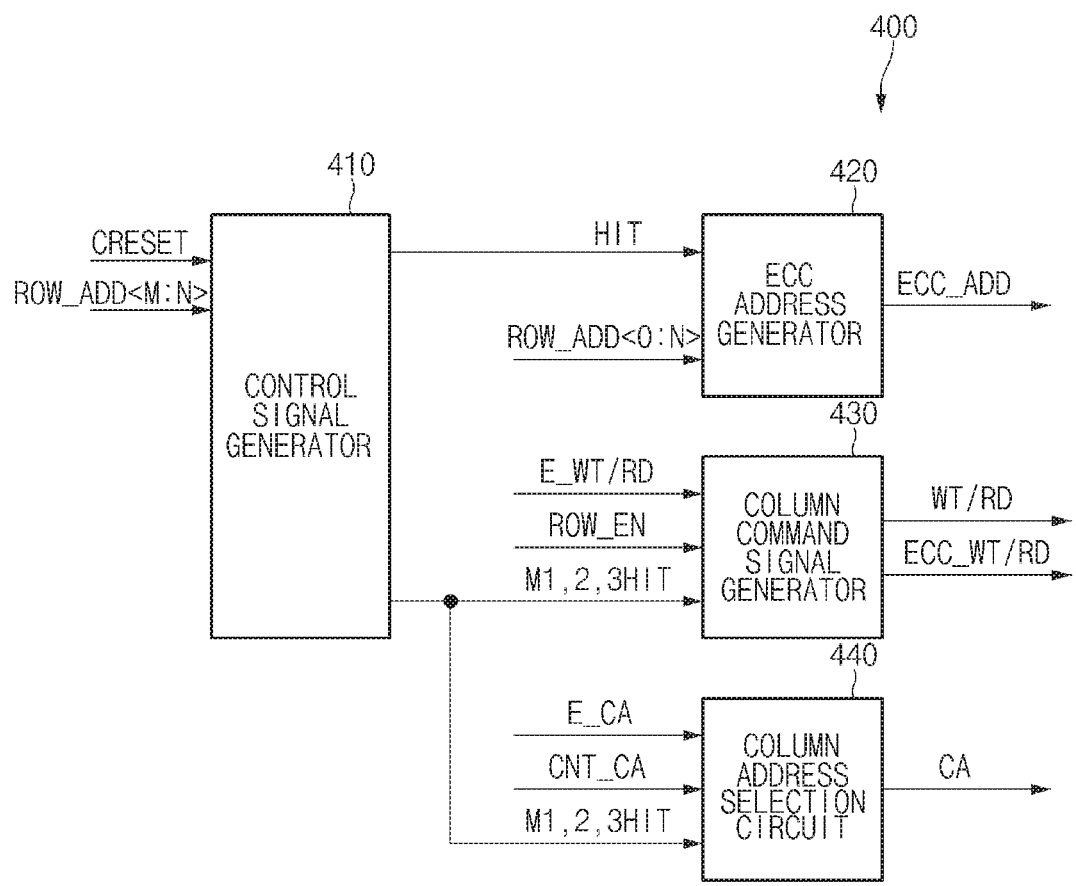
FIG. 4 is a configuration diagram illustration of a representation of an example of a command/address generator of FIG. 3.

FIG. 4 is a detailed configuration diagram illustration of a representation of an example of the command/address generator 400 of FIG. 3.

The command/address generator 400 includes a control signal generator 410, an ECC address generator 420, a column command signal generator 430, and a column address selection circuit 440.

The control signal generator 410 receives a chip reset signal CRESET and row addresses ROW_ADD<M:N> and outputs a hit signal HIT and mode selection signals M1HIT, M2HIT, and M3HIT.

In an embodiment, the case, in which the row addresses ROW_ADD<M:N> indicate the uppermost 2 bit addresses of all row addresses ROW_ADD<0:N>, has been described as an example. That is, when the number of data areas AREA in the cell array 100 is 2, the number of the row addresses ROW_ADD<M:N> may be set to 2.

However, the embodiments are not limited thereto and the number of the row addresses ROW_ADD<M:N> may be changed in correspondence to the number of the data areas AREA1 to AREA4 in the cell array 100.

The ECC address generator 420 generates an ECC address ECC_ADD in correspondence to the hit signal HIT and the row addresses ROW_ADD<0:N>. That is, the ECC address generator 420 generates the ECC address ECC_ADD in correspondence to the row addresses ROW_ADD<0:N> and the hit signal HIT indicating address information of the data area.

The column command signal generator 430 receives the external write/read signal E_WT/RD, the row enable signal ROW_EN, and the mode selection signals M1HIT, M2HIT, and M3HIT, and outputs the write/read signal WT/RD and the ECC write/read signal ECC_WT/RD.

The row enable signal ROW_EN is enabled when an active signal ACT or a refresh signal REF is activated. The write/read signal WT/RD is a command signal for writing/reading the data of the data area AREA in a normal mode. The ECC write/read signal ECC_WT/RD is a command signal for writing/reading the parity data of the ECC area 200.

The column address selection circuit 440 receives the external column address E_CA, the column address counting signal CNT_CA, the mode selection signals M1HIT, M2HIT, and M3HIT, and outputs the column address CA.

Figure 5:
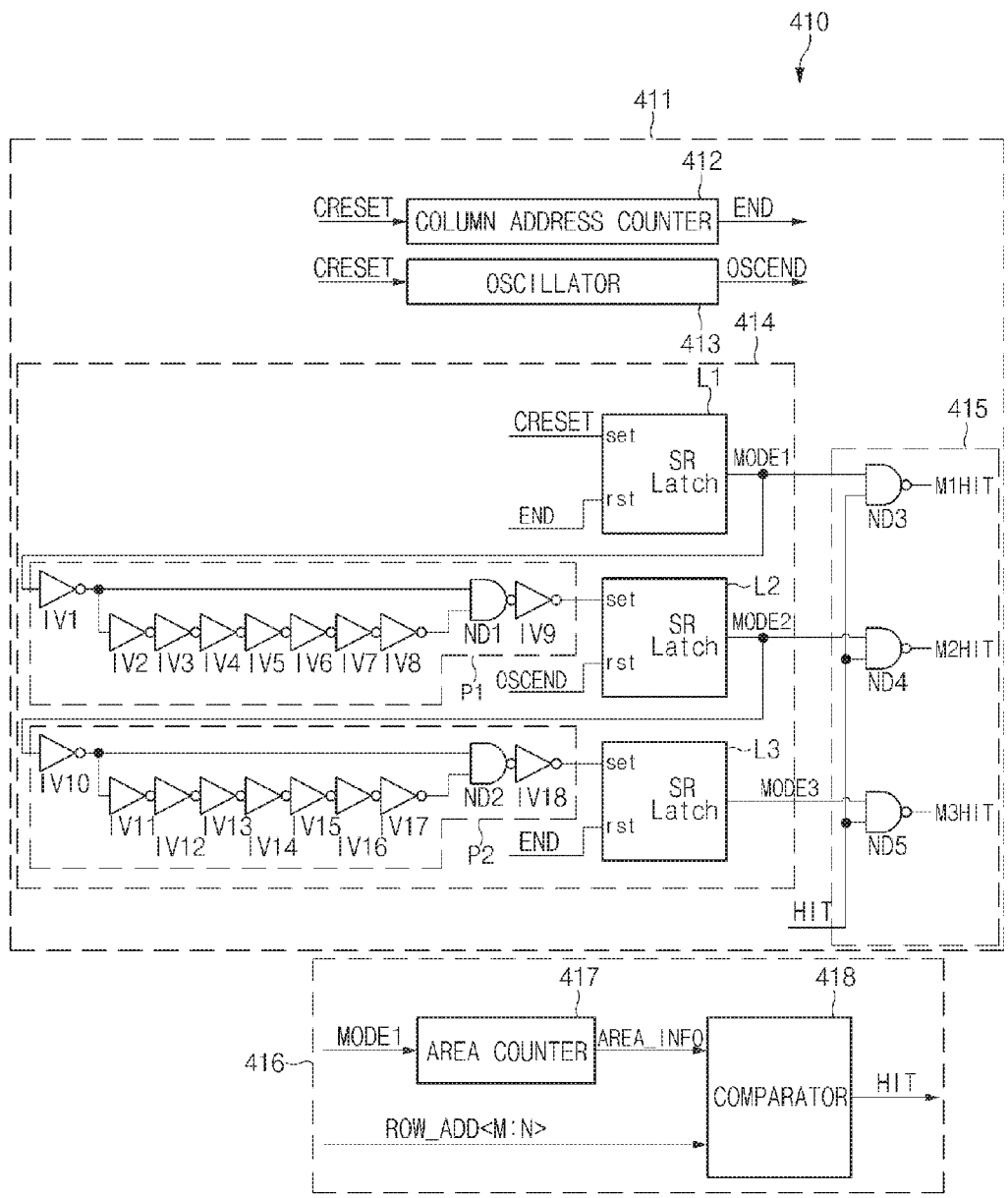
FIG. 5 is a configuration diagram illustration of a representation of an example of a control signal generator of FIG. 4.

FIG. 5 is a detailed configuration diagram illustration of a representation of an example of the control signal generator 410 of FIG. 4.

The control signal generator 410 includes a mode selection signal generator 411 and a hit signal generator 416.

The mode selection signal generator 411 latches the chip reset signal CRESET to generate mode signals MODE1, MODE2, and MODE3, and combines the hit signal HIT with the mode signals MODE1, MODE2, and MODE3 to output the mode selection signals M1HIT, M2HIT, and M3HIT. Such a mode selection signal generator 411 includes a column address counter 412, an oscillator 413, a mode generator 414, and a combination circuit 415.

The column address counter 412 counts a column address in correspondence to the chip reset signal CRESET and generates an end signal END. When the column address is activated by a preset number, the column address counter 412 activates the end signal END.

The oscillator 413 oscillates the chip reset signal CRESET and generates an oscillation end signal OSCEND. The oscillator 413 oscillates the chip reset signal CRESET only for a preset time and activates the oscillation end signal OSCEND when the preset time ends.

The mode generator 414 outputs the mode signals MODE1, MODE2, and MODE3 in correspondence to the chip reset signal CRESET, the end signal END, and the oscillation end signal OSCEND. The mode signals MODE1, MODE2, and MODE3 are sequentially activated. That is, when any one of the mode signals MODE1, MODE2, and MODE3 is activated, the remaining other mode signals enter a deactivated state.

Such a mode generator 414 includes a plurality of latches L1 to L3 and pulse generators P1 and P2. In an embodiment, the plurality of latches L1 to L3 may include SR latches, respectively.

The latch L1 corresponds to a first mode signal generation circuit, and latches the chip reset signal CRESET to output the mode signal MODE1. The latch L1 is reset in correspondence to the end signal END.

The pulse generator P1 and the latch L2 correspond to a second mode signal generation circuit, and latches the mode signal MODE1 to output the mode signal MODE2. The pulse generator P1 includes a plurality of inverters IV1 to IV9 and a NAND gate ND1.

The inverter IV1 inverts the mode signal MODE1. The plurality of inverters IV2 to IV8 coupled to one another in an inverter chain structure invert and delay the output of the inverter IV1. The NAND gate ND1 performs a NAND operation on the output of the inverter IV1 and the output of the inverter IV8. The inverter IV9 inverts the output of the NAND gate ND1.

The latch L2 latches the output of the pulse generator P1 to output the mode signal MODE2. The latch L2 is reset by the oscillation end signal OSCEND.

The pulse generator P2 and the latch L3 correspond to a third mode signal generation circuit, and latches the mode signal MODE2 to output the mode signal MODE3. The pulse generator P2 includes a plurality of inverters IV10 to IV18 and a NAND gate ND2.

The inverter IV10 inverts the mode signal MODE2. The plurality of inverters IV11 to IV17 coupled to one another in an inverter chain structure invert and delay the output of the inverter IV10. The NAND gate ND2 performs a NAND operation on the output of the inverter IV10 and the output of the inverter IV17. The inverter IV18 inverts the output of the NAND gate ND2.

The latch L3 latches the output of the pulse generator P2 to output the mode signal MODE3. The latch L3 is reset by the end signal END.

The combination circuit 415 combines the mode signals MODE1, MODE2, and MODE3 with the hit signal HIT and outputs the mode selection signals M1HIT, M2HIT, and M3HIT.

Such a combination circuit 415 includes a plurality of NAND gates ND3 to ND5. The NAND gate ND3 performs a NAND operation on the mode signal MODE1 and the hit signal HIT and outputs the mode selection signal M1HIT. The NAND gate ND4 performs a NAND operation on the mode signal MODE2 and the hit signal HIT and outputs the mode selection signal M2HIT. The NAND gate ND5 performs a NAND operation on the mode signal MODE3 and the hit signal HIT and outputs the mode selection signal M3HIT.

That is, in the state in which the hit signal HIT has been enabled to a high level, when the mode signal MODE1 is activated to a high level, the mode selection signal M1HIT has a low level. In the state in which the hit signal HIT has been enabled to a high level, when the mode signal MODE2 is activated to a high level, the mode selection signal M2HIT has a low level. In the state in which the hit signal HIT has been enabled to a high level, when the mode signal MODE3 is activated to a high level, the mode selection signal M3HIT has a low level.

The hit signal generator 416 includes an area counter 417 and a comparator 418.

The area counter 417 outputs an area signal AREA_INFO in correspondence to the mode signal MODE1. When the mode signal MODE1 is enabled, the area counter 417 performs a counting operation.

The comparator 418 compares the area signal AREA_INFO with the row addresses ROW_ADD<M:N> and outputs the hit signal HIT. The row addresses ROW_ADD<M:N> include one or more pieces of fail address information. The area signal AREA_INFO includes input address information. For example, when the area signal AREA_INFO and the row addresses ROW_ADD<M: N> coincide with each other, the comparator 418 activates the hit signal HIT to a high level and outputs the activated hit signal HIT.

The embodiments may have characteristics that the data areas AREA1 to AREA4, where the ECC is performed, are changed with the passage of time. When the data areas AREA1 to AREA4, to which the ECC is to be applied, are changed and the ECC is performed for a new area of the cell array 100, it is necessary to generate a new parity bit based on already stored cell data.

For example, it is assumed that the ECC area is changed from the data area AREA1 to the data area AREA2 as illustrated in FIG. 2. Then, instead of parity data stored in a parity area of the existing data area AREA1, parity data to be stored in a parity area of the new data area AREA2 should be updated. Such an operation may be performed in a refresh operation.

Figure 6:
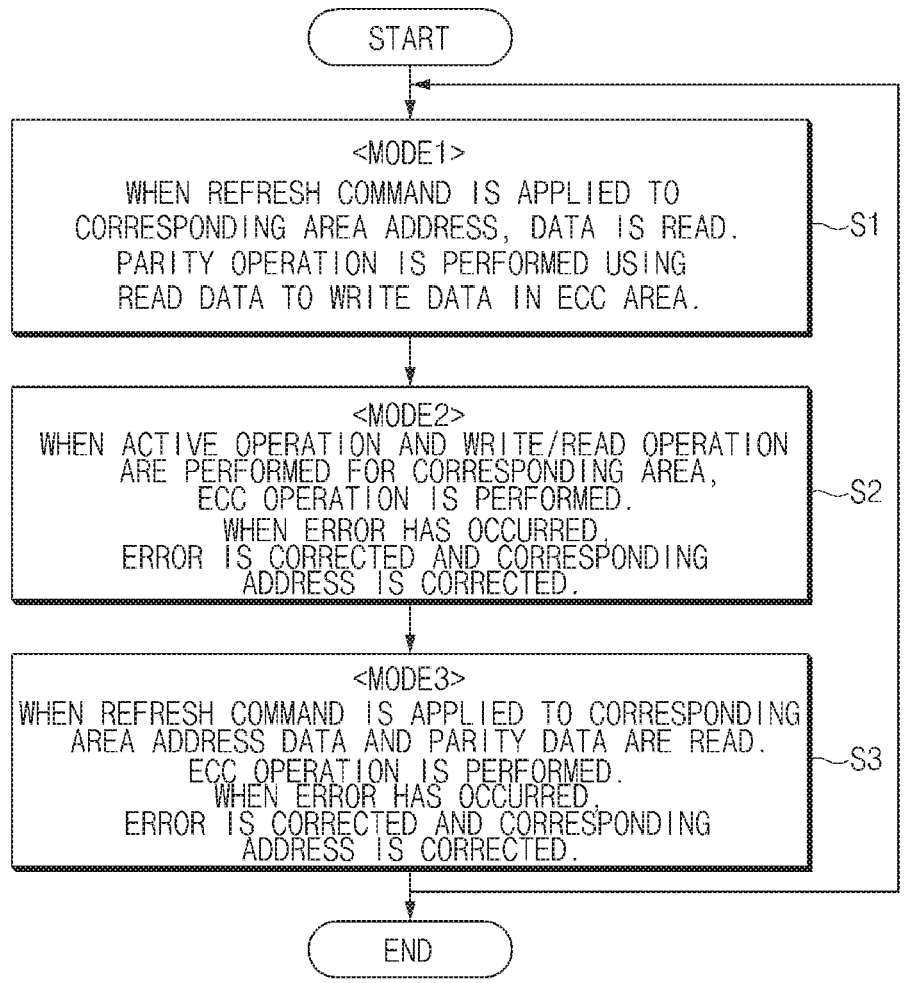
FIG. 6 is a flowchart illustrating a representation of an example for explaining an operation of a semiconductor device according to an embodiment.

FIG. 6 is a flowchart illustrating a representation of an example for explaining the operation of the semiconductor device according to an embodiment.

When the mode signal MODE1 is activated, a refresh command is applied to a corresponding area address and data is read. Then, a parity operation is performed using the read data to write data in an ECC area (step S1).

That is, when the refresh signal REF is activated in a refresh mode, it is determined whether an address to be refreshed corresponds to the data area AREA1 to which the ECC has been applied. When the address corresponds to the area to which the ECC has been applied, data for a column address is read.

When the refresh signal REF is activated, data of the data area AREA1 is checked and the parity operation is performed, so that a calculated value should be stored in the ECC area 200. A mode row address should be refreshed for each specific cycle (for example, 7.8 μs).

When a corresponding address in the data area AREA1 is refreshed, the ECC operation circuit 500 reads data during the execution of a refresh operation and performs the parity operation. Thereafter, an operation for rewriting data, which is obtained through the parity operation, in the ECC area 200 is performed.

Then, it is determined whether a refresh address REFADD corresponds to the final address of the data area AREA1. When parity bit values are calculated for all selected cells of the data area AREA1, the mode signal MODE2 is activated.

Thereafter, when the mode signal MODE2 is activated, the oscillator 413 performs an oscillation operation. Then, an active operation and a write/read operation are performed for the data area AREA2, so that an ECC operation is performed. Furthermore, when an error has occurred, the error is corrected and a corresponding address is corrected (step S2).

That is, the ECC operation is performed only for the selected data area AREA2 of the cell array 100 and the write/read operation is performed. In an activation period of the mode signal MODE2, a normal read/write operation is performed, and when accessing an area to which the ECC is applied, the ECC operation is additionally performed. In this case, a time at which the ECC operation is performed may be changed by the capacity of the ECC area 200 and the reliability of a cell and may be set as an optimal time. When the oscillation operation of the oscillator 413 is ended, the oscillation end signal OSCEND is activated, so that the mode signal MODE3 is activated.

Next, when the mode signal MODE3 is activated, a refresh command is applied to a corresponding area address. Then, the ECC operation circuit 500 reads data of the cell array 100 and parity data of the ECC area 200. Furthermore, the ECC operation circuit 500 performs the ECC operation. When an error has occurred, the error is corrected and a corresponding address is corrected (step S3).

That is, the refresh signal REF is applied to the cell array 100, so that a cell corresponding to a refresh address is refreshed. It is determined whether the refresh address corresponds to an area to which the ECC is applied, and when the refresh address corresponds to the area to which the ECC is applied, the data and the parity data are read.

Then, the ECC operation circuit 500 reads all the data of the data area AREA2 to which the ECC has been applied and the parity bit of the ECC area 200, performs parity check, and determines fail or pass. When the fail occurs, the ECC operation circuit 500 activates the flag signal FLAG through the flag generator 510 and outputs an activated row address ADD to the error correction circuit 600.

When failed data occurs, a failed address is repaired through the error correction circuit 600. After all addresses of the selected data area AREA2 are scanned, a set-up mode for performing the ECC for the next data area AREA3 is entered.

During a given ECC time, a read/write operation may be performed for a certain cell several times, but the read/write operation may be performed for a certain cell not once. It is necessary to periodically check whether fail has occurred in data of a cell having not read through the ECC operation. Accordingly, it is possible to remove in advance failure factors which may occur in cells.

When an error has occurred in the result of the ECC, a corresponding address is regarded as a failed address and an operation for repairing the failed address is performed. That is, the failed address is stored and refresh is frequently performed for a failed cell at a faster cycle, so that it is possible to improve the reliability of cell data. Alternatively, a method for copying a cell of a corresponding address and performing post-package repair may be performed. According to another method, a corresponding address may also be subjected to specification and may also be repaired.

As described above, in order to perform the ECC operation according to an embodiment, three modes are largely required. First, a data area AREA to be subjected to the ECC is changed and a set-up process of preparing an ECC operation is required (MODE1). Second, a normal ECC operation is required (MODE2). Third, an error is corrected according to a refresh command before a change to a next data area AREA (MODE3).

Figure 7:
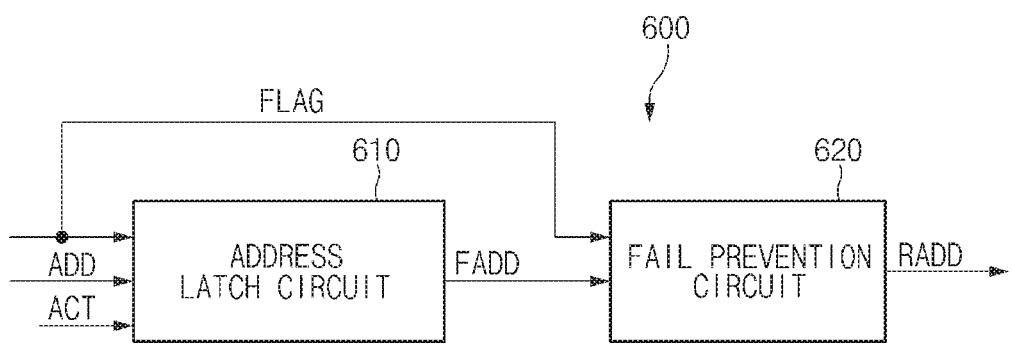
FIG. 7 is a configuration diagram illustration of a representation of an example of an error correction circuit of FIG. 3.

FIG. 7 is a configuration diagram illustration of a representation of an example of the error correction circuit 600 of FIG. 3.

The error correction circuit 600 includes an address latch circuit 610 and a fail prevention circuit 620.

The address latch circuit 610 stores the activated row address ADD applied from the ECC operation circuit 500. When the flag signal FLAG is activated, the address latch circuit 610 outputs a stored failed address to the fail prevention circuit 620. when the active signal ACT is activated, the address latch circuit 610 outputs a failed address FADD.

The address latch circuit 610 sequentially stores a row address ADD, which has been activated in synchronization with an active command, in a latch. The address latch circuit 610 latches and stores the row address ADD until a precharge operation is performed.

When fail has occurred in a specific bank and the flag signal FLAG from the ECC operation circuit 500 is activated, the address latch circuit 610 outputs the failed address FADD corresponding to failed data to the fail prevention circuit 620.

The address latch circuit 610 may be provided to each bank one by one. For example, when the number of banks is 4, four address latch circuits 610 may be provided.

The address latch circuit 610 latches the activated row address ADD while the ECC operation circuit 500 is performing the ECC operation, and outputs the failed address FADD to the fail prevention circuit 620. In this case, when the flag signal FLAG is activated, the address latch circuit 610 outputs the latched failed address FADD to the fail prevention circuit 620.

The address latch circuit 610 may latch row address information until a row address is applied to a row line of a bank and a column address is selected for a column line. A predetermined time is required until the row address is applied and the column address is applied in order to select a memory cell of a bank.

Accordingly, when the row address ADD applied from the ECC operation circuit 500 is not stored until the row address is applied and the column address is applied, information on a failed address may be lost. In this regard, in an embodiment, the row address ADD applied from the ECC operation circuit 500 is stored through the address latch circuit 610 for a predetermined time.

The fail prevention circuit 620 performs an operation for repairing failed data in correspondence to the flag signal FLAG and the failed address FADD. An address in which 1-bit fail has occurred may be corrected by the on-die ECC operation circuit 500. However, when the 1-bit fail occurs and then additional 1-bit fail occurs again, correction of a failed cell is not possible.

In this regard, in an embodiment, when the 1-bit fail occurs, an error is corrected by the ECC operation circuit 500, and a failed cell is repaired in the fail prevention circuit 620 such that additional fail does not occur in the cell. That is, when an error has occurred in a bank, the fail prevention circuit 620 substantially prevents an error from occurring in a corresponding address of failed data.

There may various circuits for repairing a failed address such that an error does not occur therein. In an embodiment, a failed address is regarded to correspond to a weak cell and an additional refresh operation is performed for a failed cell, thereby repairing the failed cell such that an error does not occur in the address.

Such a fail prevention circuit 620 outputs the row address RADD to each bank and refreshes a failed cell, thereby repairing failed data.

When the flag signal FLAG is activated, the fail prevention circuit 620 outputs the row address RADD for refreshing failed cells to a corresponding bank in correspondence to the failed address FADD.

The fail prevention circuit 620 may also adjust the number of times of refresh on the basis of an address of at least one weak cell having a data retention time shorter than that of a normal cell among a plurality of memory cells. In this case, the fail prevention circuit 620 may control a refresh operation to be performed for weak cells at least twice in a refresh cycle defined in the standard.

That is, in a test mode, the fail prevention circuit 620 performs a refresh operation and stores address information on cells having weak address characteristics. Furthermore, when the failed address FADD corresponds to a weak cell, the fail prevention circuit 620 may control the number of times of a refresh operation to be increased.

A volatile memory device such as a dynamic random access memory (DRAM) performs a refresh operation in order to substantially maintain stored data. When a memory cell of the volatile memory device has a data retention time shorter than a refresh cycle defined in the standard, a row line including the memory cell should be replaced with a row line of a redundancy cell.

As the size of a memory cell is reduced, the number of memory cells having a data retention time shorter than a refresh cycle increases, resulting in an increase in the number of redundancy cells.

Accordingly, it is necessary to adaptively perform a refresh operation according to data retention characteristics of respective memory cells while substantially maintaining a refresh time interval according to the standard of the semiconductor device. In the case of adaptively performing the refresh operation according to the data retention characteristics of respective memory cells, it is possible to reduce the number of row lines which should be replaced with row lines of a redundancy cell.

In an embodiment, the case in which the fail prevention circuit 620 repairs a failed cell by performing an additional refresh operation for the failed address FADD has been described as an example; however, the embodiments are not limited thereto and the fail prevention circuit 620 may also repair a failed cell through a soft repair scheme.

The soft repair scheme may perform an operation for replacing a specific row address with a redundant word line when fail has occurred in the specific row address. Accordingly, the fail prevention circuit 620 may use a word line copy scheme of storing data stored in a cell in the redundant word line.

That is, the fail prevention circuit 620 may use a scheme of enabling a failed word line, latching data through a sense amplifier, enabling the redundant word line, and then allowing substantially the same data to be written in the redundant word line through the sense amplifier.

Figure 8:
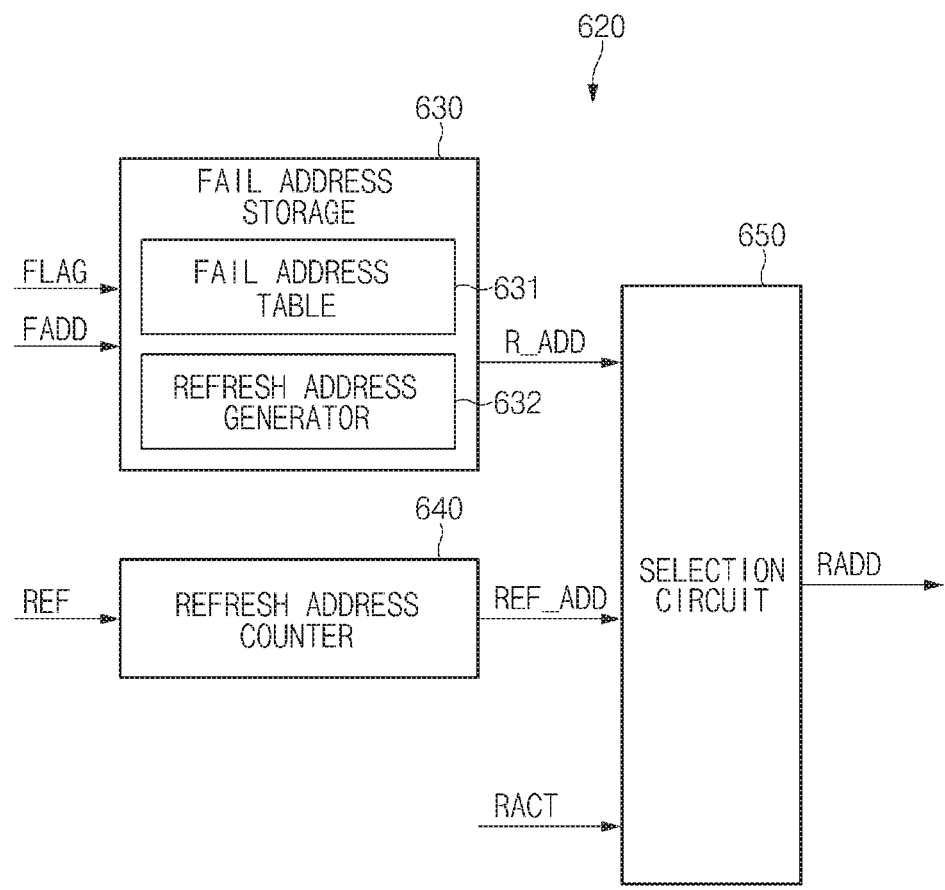
FIG. 8 is a configuration diagram illustration of a representation of an example of a fail prevention circuit of FIG. 7.

FIG. 8 is a configuration diagram illustration of a representation of an example of the fail prevention circuit 620 of FIG. 7.

The fail prevention circuit 620 includes a fail address storage 630, a refresh address counter 640, and a selection circuit 650. The fail address storage 630 includes a fail address table 631 and a refresh address generator 632.

The fail address storage 630 stores the failed address FADD, which is applied from the address latch circuit 610 when the flag signal FLAG is activated, in the fail address table 631. The failed address FADD may be sequentially stored in a predetermined number of lines of the fail address table 631. The fail address table 631 may include a latch part.

The fail address table 631 may include a table address field indicating addresses of each line and a refresh address field in which the failed address FADD requiring a refresh operation is stored.

In the refresh address field, a refresh address corresponding to the failed address FADD may be stored as bit information. A refresh address R_ADD stored in the fail address table 631 may be sequentially outputted by the refresh address generator 632.

For example, when the flag signal FLAG is activated, the refresh address generator 632 may sequentially output the failed address FADD stored in the fail address table 631 as the refresh address R_ADD by an operation of a counter. That is, the refresh address generator 632 outputs the failed address FADD stored in each line of the fail address table 631 as the refresh address R_ADD for performing a refresh operation.

In an embodiment, the case in which the fail address table 631 includes a latch part has been described as an example; however, the embodiments are not limited thereto and the fail address table 631 may also be implemented with a one-time programmable memory such as a laser programmable fuse memory, an anti-fuse memory, and an electrically programmable fuse memory or a nonvolatile memory such as a MRAM (Magnetic Random Access Memory), a RRAM (Resistive Random Access Memory), a PRAM (Phase change Random Access Memory), and a flash memory.

In a normal operation, the fail prevention circuit 620 performs a refresh operation in correspondence to the refresh address counter 640. The refresh address counter 640 counts the refresh signal REF and outputs a refresh address REF_ADD for sequentially refreshing an entire memory cell array.

The refresh signal REF may be generated in response to a refresh command periodically applied from a host apparatus. The refresh signal REF may be an auto-refresh signal which is applied by a command of a memory controller in a normal access mode of the semiconductor device. The refresh signal REF may also be generated by a built-in timer included in the semiconductor device.

The selection circuit 650 selects any one of the refresh address R_ADD applied from the fail address storage 630 and the refresh address REF_ADD applied from the refresh address counter 640 in correspondence to a row active signal RACT, and outputs the row address RADD.

For example, when the row active signal RACT is at a first logic level (for example, a logic high level), the selection circuit 650 selects the refresh address REF_ADD applied from the refresh address counter 640. However, when the row active signal RACT is at a second logic level (for example, a logic low level), the selection circuit 650 selects the refresh address R_ADD applied from the fail address storage 630.

The selection circuit 650 may include a multiplexer for selecting any one of the refresh address R_ADD and the refresh address REF_ADD in correspondence to the row active signal RACT, a transmission gate, and the like.

The semiconductor device according to an embodiment may also include a dynamic random access memory (DRAM) such as a DDR SDRAM (Double Data Rate Synchronous Dynamic Random Access Memory), a LPDDR (Low Power Double Data Rate) SDRAM, a GDDR (Graphics Double Data Rate) SDRAM, and a RDRAM (Rambus Dynamic Random Access Memory) or an arbitrary volatile memory device requiring a refresh operation.

Figure 9:
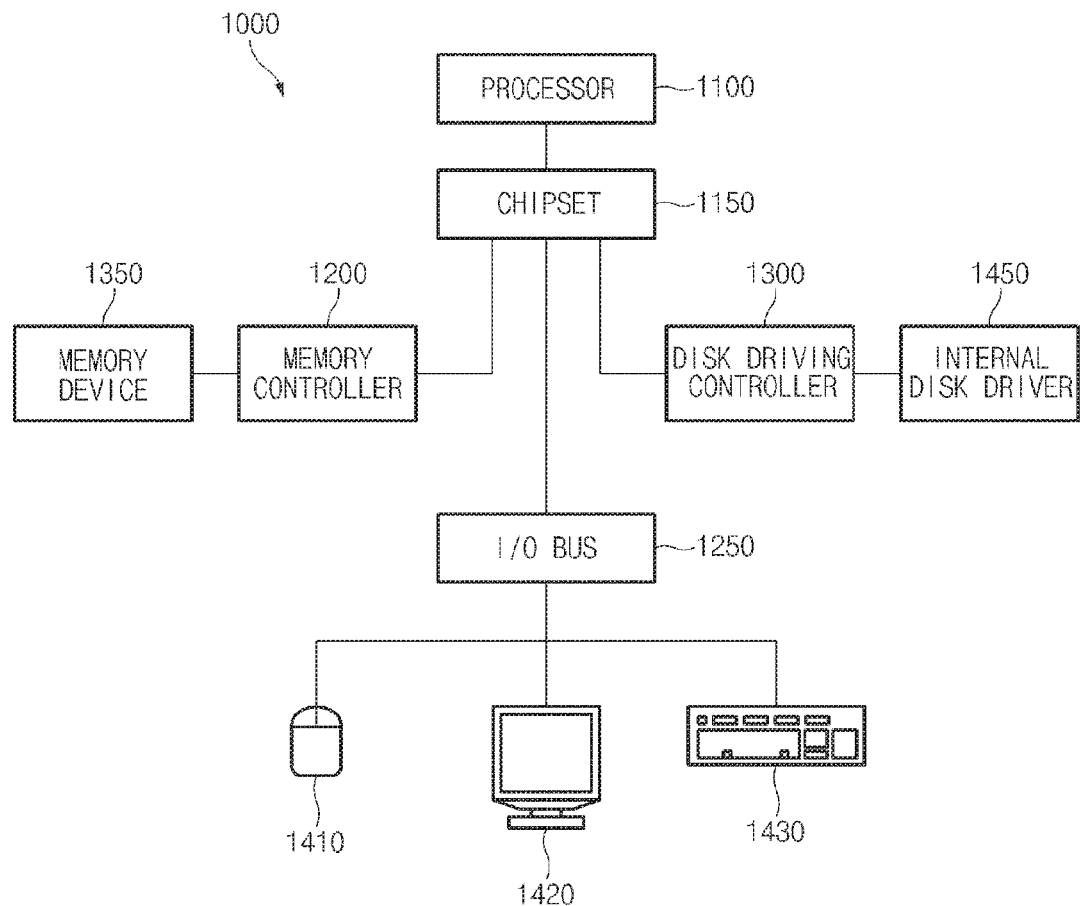
FIG. 9 illustrates a block diagram of an example of a representation of a system employing a semiconductor device and or method of driving the semiconductor device with the various embodiments discussed above with relation to FIGS. 1-8.

The semiconductor devices and or methods of driving the semiconductor devices as discussed above (see FIGS. 1-8) are particular useful in the design of memory devices, processors, and computer systems. For example, referring to FIG. 9, a block diagram of a system employing a semiconductor device and or method of driving the semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driving controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or method of driving the semiconductor device as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or method of driving the semiconductor device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driving controller 1300 may be operably coupled to the chipset 1150. The disk driving controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driving controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a semiconductor device and or method of driving the semiconductor device as discussed above with relation to FIGS. 1-8. In alternate embodiments, such as, for example but not limited to, cellular phones or digital cameras, the components may differ from the embodiments illustrated in FIG. 9.

While various embodiments have been described above, it will be understood to those skilled in the art that the embodiments described are by way of example only. Accordingly, the semiconductor device and the driving method thereof described herein should not be limited based on the described embodiments.

What is claimed is:

1. A semiconductor device comprising:
   a cell array configured to divide a plurality of data areas, wherein the plurality of data areas is sequentially changed, a data area selected from the plurality of data areas to be subjected to an Error Correction Code (ECC) operation in correspondence to an ECC address based on a refresh operation corresponding to a refresh address;
   an ECC area in which the ECC operation is performed in correspondence to the data area selected from the plurality of data areas and parity data corresponding to the plurality of data areas is sequentially stored;
   a command/address generator configured to generate the ECC address for changing the data area and control a read/write operation of data of the cell array and the parity data based on the changing of the data area, and
   a control circuit configured to output control signals for controlling an operation of a command/address generator in correspondence to a refresh address, and active signal, and a refresh signal.

2. The semiconductor device of claim 1, wherein the command/address generator receives a row address, an external write/read signal, a row enable signal, an external column address, a column address counting signal, and a chip select signal, and outputs the ECC address and an ECC write/read signal to the ECC area while outputting a column address and a write/read signal to the cell array.

3. The semiconductor device of claim 1, wherein the command/address generator comprises:
   a control signal generator configured to generate a hit signal indicating address information of the data area and a plurality of mode selection signals in correspondence to a chip select signal and a row address;
   an ECC address generator configured to generate the ECC address in correspondence to the hit signal and the row address;
   a column command signal generator configured to receive an external write/read signal, a row enable signal, and the plurality of mode selection signals, and output a write/read signal for reading/writing the data of the cell array and an ECC write/read signal for reading/writing a parity bit of the ECC area; and
   a column address selection circuit configured to receive an external column address, a column address counting signal, and the plurality of mode selection signals, and output a column address.

4. The semiconductor device of claim 3, wherein the control signal generator comprises:
   a mode selection signal generator configured to latch the chip reset signal to generate a plurality of mode signals, and combine the hit signal with the plurality of mode signals to output the plurality of mode selection signals; and
   a hit signal generator configured to generate the hit signal in correspondence to any one of the plurality of mode signals and the row address.

5. The semiconductor device of claim 4, wherein the mode selection signal generator comprises:
   a column address counter configured to count a column address in correspondence to the chip reset signal and output an end signal;
   an oscillator configured to count the chip reset signal and generate an oscillation end signal;
   a mode generator configured to latch the chip reset signal and output the plurality of mode signals which are sequentially activated; and
   a combination circuit configured to combine the plurality of mode signals with the hit signal and output the plurality of mode selection signals.

6. The semiconductor device of claim 5, wherein the mode generator comprises:
   a first latch configured to latch the chip reset signal to generate a first mode signal and to be reset by the end signal;
   a first pulse generator configured to delay the first mode signal and generate a pulse signal;
   a second latch configured to latch output of the first pulse generator to generate a second mode signal and to be reset by the oscillation end signal;
   a second pulse generator configured to delay the second mode signal and generate a pulse signal; and
   a third latch configured to latch output of the second pulse generator to generate a third mode signal and to be reset by the end signal.

7. The semiconductor device of claim 5, wherein the combination circuit performs a logic operation on the plurality of mode signals and the hit signal and outputs the plurality of mode selection signals.

8. The semiconductor device of claim 4, wherein the hit signal generator comprises:
   an area counter configured to count any one of the plurality of mode signals and generate an area signal; and
   a comparator configured to compare the row address with the area signal and generate the hit signal.

9. The semiconductor device of claim 1, further comprising:

an ECC operation circuit configured to correct an error of a failed cell in correspondence to the data and the parity data, and output a flag signal, which is activated based on failed data occurring, and an activated row address; and an error correction circuit configured to perform an operation for repairing the failed data in correspondence to the flag signal and a failed address.

10. The semiconductor device of claim 9, wherein the ECC operation circuit further comprises: a flag generator configured to detect occurrence of the failed data and activate the flag signal.

11. The semiconductor device of claim 9, wherein the error correction circuit comprises:

an address latch circuit configured to sequentially store the row address applied from the ECC operation circuit in correspondence to an active command, and output the failed address in correspondence to the flag signal; and a fail prevention circuit configured to perform an operation for repairing the failed data in correspondence to the flag signal and the failed address.

12. The semiconductor device of claim 11, wherein the fail prevention circuit comprises:

a refresh address counter configured to count a refresh signal in a normal operation and output a first refresh address;

a fail address storage configured to sequentially store the failed address when the flag signal is activated, and output a second refresh address corresponding to the failed address; and a selection circuit configured to select the first refresh address or the second refresh address in correspondence to a row active signal.

13. The semiconductor device of claim 12, wherein the fail address storage comprises:

a fail address table configured to store the failed address; and a refresh address generator configured to output the second refresh address in correspondence to the failed address.

14. The semiconductor device of claim 13, wherein the refresh address generator sequentially outputs the second refresh address.

15. The semiconductor device of claim 12, wherein the selection circuit selects the first refresh address so as to be outputted as a row address when the row active signal is at a first logic level; and selects the second refresh address so as to be outputted as the row address when the row active signal is at a second logic level.

16. A driving method of a semiconductor device, comprising the steps of:

receiving a refresh signal in a refresh mode;

reading data of a corresponding data area selected from a plurality of data areas when the refresh signal is activated;

performing a parity operation based on an Error Correction Code (ECC) address, and writing a parity bit received from a parity line in an ECC area;

performing an ECC operation for the corresponding data area when an active operation, a write operation and a read operation is performed and correcting an error; and reading data of the corresponding data area and the parity bit when a next refresh signal is applied, performing an ECC operation, and correcting an error.

17. The driving method of the semiconductor device of claim 16, further comprising the steps of:

outputting a flag signal, which is activated based on failed data occurring, and an activated row address; and performing an operation for repairing the failed data in correspondence to the flag signal and a failed address.

* * * * *